US009972513B2

United States Patent
Saito et al.

(10) Patent No.: US 9,972,513 B2
(45) Date of Patent: May 15, 2018

(54) DEVICE AND METHOD FOR TREATING A SUBSTRATE WITH HYDROFLUORIC AND NITRIC ACID

(71) Applicant: SHIBAURA MECHATRONICS CORPORATION, Yokohama-shi, Kanagawa (JP)

(72) Inventors: Yuki Saito, Yokohama (JP); Konosuke Hayashi, Yokohama (JP); Takashi Ootagaki, Yokohama (JP); Yuji Nagashima, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 0 days. days.

(21) Appl. No.: 15/450,542

(22) Filed: Mar. 6, 2017

(65) Prior Publication Data
US 2017/0256423 A1    Sep. 7, 2017

(30) Foreign Application Priority Data

Mar. 7, 2016   (JP)  ................................. 2016-043869
Feb. 16, 2017   (JP)  ................................. 2017-027341

(51) Int. Cl.
    *H01L 21/00*      (2006.01)
    *H01L 21/67*      (2006.01)

(52) U.S. Cl.
    CPC .... *H01L 21/6708* (2013.01); *H01L 21/67253* (2013.01)

(58) Field of Classification Search
    CPC ..................... H01L 21/6708; H01L 21/67253
    USPC .......................................................... 438/5
    See application file for complete search history.

(56) References Cited

U.S. PATENT DOCUMENTS

| | | | | |
|---|---|---|---|---|
| 6,156,968 A | * | 12/2000 | Nishimoto | .......... H01L 31/1804 136/252 |
| 9,811,096 B2 | * | 11/2017 | Hayashi | ............ H01L 21/67017 |
| 2006/0068591 A1 | * | 3/2006 | Radosavljevic | .. H01L 21/28079 438/689 |

(Continued)

FOREIGN PATENT DOCUMENTS

| | | |
|---|---|---|
| JP | 11-026425 A | 1/1999 |
| TW | 201542301 A | 11/2015 |
| WO | 2015136872 A1 | 9/2015 |

OTHER PUBLICATIONS

Office Action issued in corresponding Taiwanese Patent Application No. 106106833 dated Jan. 24, 2018, consisting of 4 pp.

*Primary Examiner* — Caleb Henry
(74) *Attorney, Agent, or Firm* — Volpe and Koenig, P.C.

(57) ABSTRACT

According to the embodiment, a substrate treating device 10 for treating a semiconductor wafer W using an etchant L containing hydrofluoric acid and nitric acid includes a storage tank 210 that stores the etchant L; a concentration sensor 256 that measures a concentration of nitrous acid in the etchant L; an alcohol feeding line 280 that feeds IPA to the etchant L and maintains the concentration of nitrous acid to a predetermined value or more; and a substrate treating unit 100 that feeds the etchant L in the storage tank 210 to the semiconductor wafer W. The substrate treating device can improve the etching efficiency by efficiently generating nitrous acid, and thereby producing an etchant having a nitrous acid concentration suitable for etching.

9 Claims, 4 Drawing Sheets

(56) References Cited

U.S. PATENT DOCUMENTS

| | | | |
|---|---|---|---|
| 2008/0236620 A1* | 10/2008 | Shih | B08B 3/08 |
| | | | 134/9 |
| 2009/0099681 A1* | 4/2009 | Arndt | H01L 21/67253 |
| | | | 700/121 |
| 2015/0118785 A1* | 4/2015 | Kashkoush | H01L 21/67086 |
| | | | 438/71 |
| 2016/0093516 A1* | 3/2016 | Okuda | H01L 21/6715 |
| | | | 216/83 |
| 2016/0233374 A1* | 8/2016 | Knight | H01L 31/02167 |
| 2017/0014873 A1 | 1/2017 | Higuchi | |
| 2017/0092532 A1* | 3/2017 | Kaba | H01L 21/67051 |

* cited by examiner

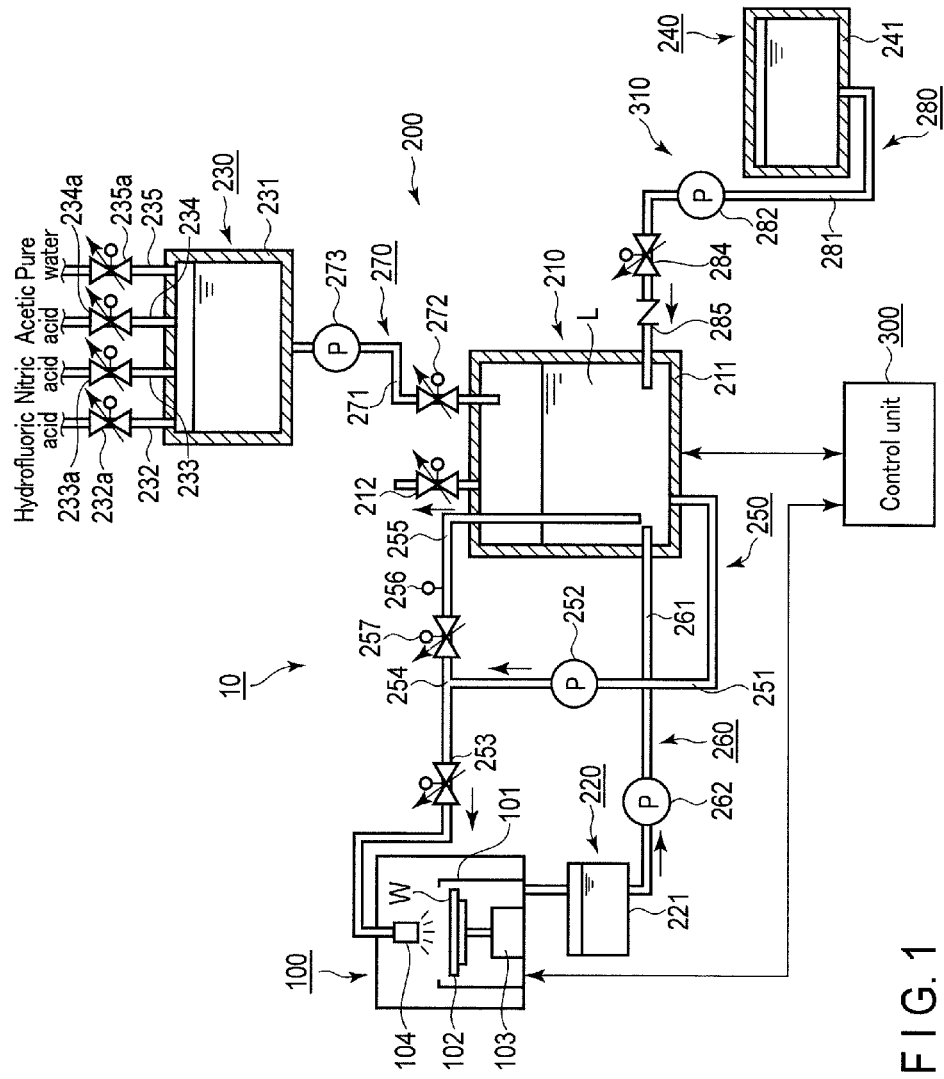
F I G. 1

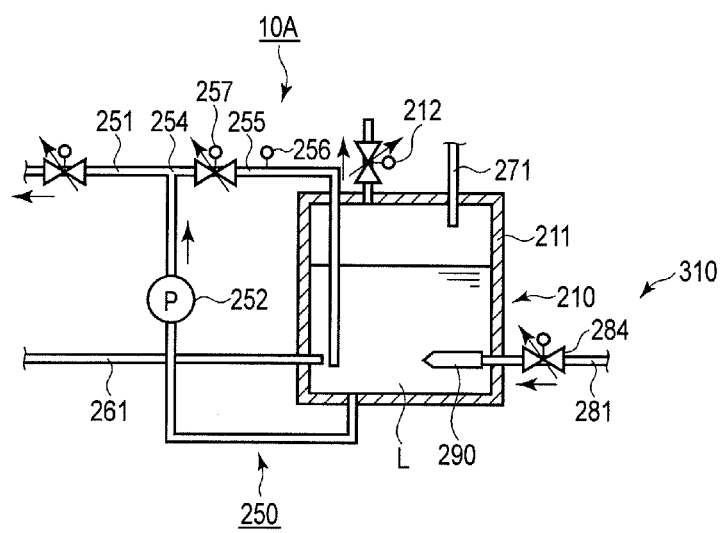
F I G. 4

DEVICE AND METHOD FOR TREATING A SUBSTRATE WITH HYDROFLUORIC AND NITRIC ACID

CROSS-REFERENCE TO RELATED APPLICATIONS

This application is based upon and claims the benefit of priority from the prior Japanese Patent Application No. 2016-043869, filed Mar. 7, 2016, and No. 2017-027341, filed Feb. 16, 2017, the entire contents both of which are incorporated herein by reference.

FIELD

Embodiments described herein relate generally to a substrate treating device and a substrate treating method for feeding a treatment liquid to a substrate such as a semiconductor wafer and treating the substrate.

BACKGROUND

There is known a substrate treating device used in a wet etching process for an electronic component such as a semiconductor device or a liquid crystal display (for example, see Jpn. Pat. Appln. KOKAI Publication No. 11-26425). Concerning the substrate treating device, as a method of removing a strained layer formed on a substrate surface or an impurity such as a heavy metal existing on a substrate surface in the manufacturing process of a substrate such as a semiconductor wafer, a method of etching the substrate surface by a drug solution is known.

As the etching method, for example, a method of performing etching by feeding an etchant prepared by mixing hydrofluoric acid (HF), nitric acid ($HNO_3$), and pure water at a predetermined mixing ratio to a semiconductor wafer is used. It is known that nitrous acid ($HNO_2$) in the etchant contributes to etching. For this reason, an Si substrate (for example, semiconductor wafer) is dissolved in a solution containing hydrofluoric acid and nitric acid, thereby generating nitrous acid and thus generating an etchant.

The above-described substrate treating device has the following problem. That is, if the nitrous acid concentration in the etchant is low, the etching process time of the semiconductor wafer becomes long. Hence, the Si substrate needs to be dissolved in a sufficient amount. However, the Si substrate takes time to dissolve, and productivity lowers.

SUMMARY

Accordingly, an object of the present invention is to provide a substrate treating device and a substrate treating method that can improve the etching efficiency by efficiently generating nitrous acid, and thereby producing an etchant having a nitrous acid concentration suitable for etching.

In order to achieve the object, a substrate treating device and a substrate treating method of the invention is configured as follows.

A substrate treating device according to the present invention, for treating a substrate using a treatment liquid containing hydrofluoric acid and nitric acid, includes a storage tank configured to store the treatment liquid, an alcohol feeding unit configured to feed alcohol to the treatment liquid, and a feeding unit configured to feed, to the substrate, the treatment liquid to which the alcohol is fed.

A substrate treating method according to the present invention, of treating a substrate using a treatment liquid containing hydrofluoric acid and nitric acid, includes storing the treatment liquid in a storage tank, feeding alcohol to the treatment liquid, and feeding, to the substrate, the treatment liquid to which the alcohol is fed.

According to the present invention, it is possible to improve the etching efficiency by efficiently generating nitrous acid, and thereby producing an etchant having a nitrous acid concentration suitable for etching.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is an explanatory view schematically showing a substrate treating device according to an embodiment of the present invention;

FIG. 4 is an explanatory view showing a modification of the substrate treating device.

DETAILED DESCRIPTION

Figure 2:
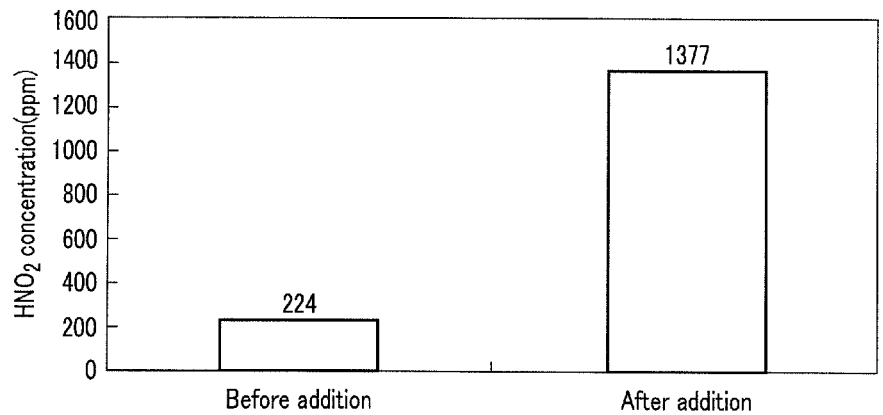
FIG. 2 is an explanatory view showing a nitrous acid generation amount in the substrate treating device.
Figure 3:
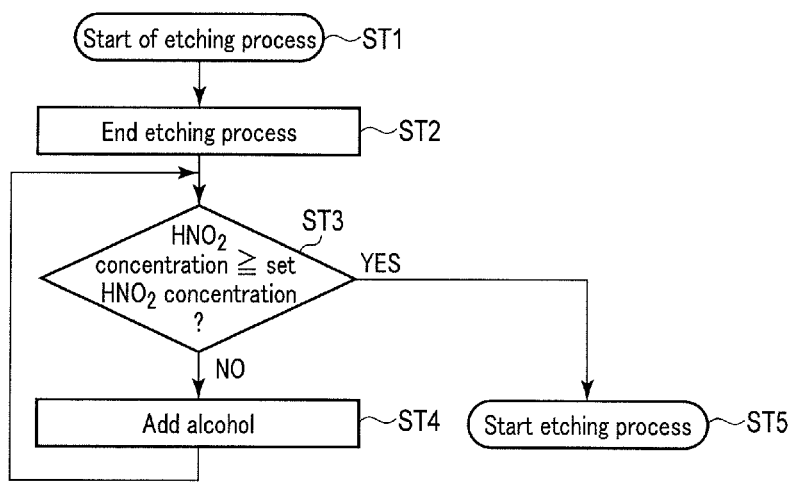
FIG. 3 is an explanatory view showing the operation procedure of the substrate treating device.

FIG. 1 is an explanatory view schematically showing a substrate treating device 10 according to an embodiment of the present invention. FIG. 2 is an explanatory view showing a nitrous acid generation amount in the substrate treating device 10. FIG. 3 is an explanatory view showing the operation procedure of the substrate treating device 10. Note that in FIG. 1, W represents a wafer (substrate).

The substrate treating device 10 includes a substrate treating unit 100, an etchant feeding unit 200 that feeds an etchant L to the substrate treating unit 100, and a control unit 300 that cooperatively controls the substrate treating unit 100 and the etchant feeding unit 200.

The substrate treating unit 100 has a structure in which a wafer chuck 102 that supports the wafer W in a cup body 101 is rotated by a motor 103. As will be described later, an etching treatment liquid fed from the etchant feeding unit 200 is fed from a nozzle (feeding unit) 104 arranged on the upper side of the semiconductor wafer W to the semiconductor wafer W. By the etching treatment liquid, an etching process is performed for the surface of the semiconductor wafer W that rotates along with the rotation of the wafer chuck 102.

The etchant feeding unit 200 includes a storage tank 210 that stores an etchant, a recovery tank 220 that stores a used etchant, a new liquid feeding tank 230 that stores a new liquid prepared by mixing hydrofluoric acid, nitric acid, acetic acid ($CH_3COOH$), and pure water at a predetermined ratio, and an alcohol feeding tank 240 that stores IPA (isopropyl alcohol) as an example of alcohol. An etchant feeding line 250 and a recovery line 260 are provided between the storage tank 210 and the substrate treating unit 100. The recovery tank 220 is provided halfway on the recovery line 260. A new liquid feeding line 270 is provided between the new liquid feeding tank 230 and the storage tank 210. An alcohol feeding line 280 is provided between the alcohol feeding tank 240 and the storage tank 210.

The storage tank 210 includes a well-closed tank main body 211, and an open valve 212 provided on the upper side of the tank main body 211.

The recovery tank 220 includes a well-closed tank main body 221. The new liquid feeding tank 230 includes a well-closed tank main body 231. The alcohol feeding tank 240 includes a well-closed tank main body 241.

A hydrofluoric acid feeding pipe 232, a nitric acid feeding pipe 233, an acetic acid feeding pipe 234, and a pure water feeding pipe 235 are connected to the new liquid feeding tank 230, which are provided with on-off valves 232a, 233a, 234a, and 235a, respectively. Predetermined amounts of liquids are fed from the feeding pipes 232 to 235 such that they are mixed at a predetermined ratio, as described above.

The etchant feeding line 250 includes a main line 251 with an inlet end provided on the bottom portion of the tank main body 211 and an outlet end connected to the nozzle 104 of the substrate treating unit 100, a pump 252 and an on-off valve 253 provided halfway on the main line 251, a branch portion 254 provided between the pump 252 and the nozzle 104, and a return line 255 that returns from the branch portion 254 to the tank main body 211. A concentration sensor 256 configured to measure the concentration of nitrous acid and an on-off valve 257 are provided halfway on the return line 255. Note that the concentration sensor 256 may be provided halfway on the main line 251.

The recovery line 260 includes a main line 261 with an inlet end provided on the bottom portion of the substrate treating unit 100 and an outlet end provided in the tank main body 211. The tank main body 221 and a pump 262 are provided on the main line 261.

The new liquid feeding line 270 includes a main line 271 with an inlet end provided on the bottom portion of the tank main body 231 and an outlet end provided on the ceiling portion of the tank main body 211, and an on-off valve 272 and a pump 273 provided halfway on the main line 271.

The alcohol feeding line 280 includes a main line 281 with an inlet end provided on the bottom portion of the tank main body 241 and an outlet end connected to the tank main body 211, a pump 282 provided halfway on the main line 281, and a branch portion 283, an on-off valve 284, and a check valve 285 provided between the pump 282 and the tank main body 211.

The position at which the outlet end of the main line 281 is connected to the tank main body 211 is located on a side wall below the liquid surface of the etchant L fed to the tank main body 211. That is, as shown in FIG. 1, IPA is directly fed into the etchant L in a state in which the etchant L builds up to some extent in the tank main body 211. In consideration of the fact that the liquid surface of the etchant L varies and the fact that the IPA has a specific gravity lower than that of the etchant L, the outlet end of the main line 281 should be preferably provided either on a lower portion of the side wall that is close to the bottom wall of the tank main body 211 or on the bottom wall, so as to prevent the IPA from reacting only near the liquid surface of the etchant L.

In the present embodiment, the alcohol feeding tank 240, the alcohol feeding line 280, the main line 281, the pump 282, the on-off valve 284 and the check valve 285 jointly constitute an alcohol feeding section 310.

Note that each of the above-described on-off valves and each of the pumps are controlled by the control unit 300. A set nitrous acid concentration (a predetermined value of the nitrous acid concentration) is stored, for example, in the control unit 300. The control unit 300 controls the substrate treating device 10, as will be described below.

The present embodiment will be described, referring to the case where the substrate is a semiconductor wafer and an oxide film formed on the surface of the semiconductor wafer is removed by etching.

First, preparation before the start of the process will be described. Before the start of the process, all valves are closed. Next, the on-off valves 232a, 233a, 234a, and 235a of the hydrofluoric acid feeding pipe 232, the nitric acid feeding pipe 233, the acetic acid feeding pipe 234, and the pure water feeding pipe 235 connected to the tank main body 231 are opened/closed to feed predetermined amounts of hydrofluoric acid, nitric acid, acetic acid, and pure water from the feeding pipes 232 to 235 such that they are mixed at a predetermined ratio set in advance, thereby generating the new etchant L. Next, the open valve 212 and the on-off valve 272 are opened, and the pump 273 is actuated to feed the new etchant L into the tank main body 211 of the storage tank 210. If a predetermined amount of the new etchant L builds up in the tank main body 211, the on-off valve 272 is closed to stop feeding. Then, the open valve 212 is closed, the on-off valve 257 is opened, and the pump 252 is actuated to circulate the etchant L. When the etchant L passes through the concentration sensor 256, the nitrous acid concentration in the etchant L is detected. Although nitric acid decomposes by itself to generate nitrous acid, the nitrous acid concentration in the etchant L is low at first.

Next, the open valve 212 and the on-off valve 284 on the main line 281 of the alcohol feeding line 280 are opened, and the pump 282 is driven to feed IPA to the tank main body 211. In the tank main body 211, nitric acid in the etchant L decomposes to generate nitrous acid and nitric acid gas. This increases the nitrous acid concentration in the etchant L. The alcohol feeding section 310 continues IPA feeding to the tank main body 211 until the nitrous acid concentration detected by the concentration sensor 256 reaches a predetermined value. When the nitrous acid concentration reaches the predetermined value, the open valve 212 and the on-off valve 284 are closed. Then, the pump 282 is stopped to stop IPA feeding. Other than determining the IPA feed amount by the concentration sensor 256, the necessary IPA feed amount may be calculated based on such a condition as a predetermined process time or a predetermined number of semiconductor wafers to be treated.

FIG. 2 is an explanatory view illustrating how the nitrous acid concentration differs between a where no IPA is added to 100 cc of a mixed solution containing hydrofluoric acid, nitric acid, acetic acid, and pure water (nitric acid concentration: 23.8%) and a case where 5 μL of IPA is added. If the solution is left alone, the nitrous acid concentration is 224 ppm. However, if IPA is added, the nitrous acid concentration is 1377 ppm, implementing a six-times higher concentration.

Turning back to FIG. 1, when the amount of the etchant L in the tank main body 211 and the nitrous acid concentration reach predetermined values, the pump 252 is stopped to stop circulation of the etchant L.

The etching process will be described next with reference to FIG. 3. When the etching process starts (step ST1), the open valve 212 and the on-off valve 253 are opened, the on-off valve 257 is closed, and the pump 252 is driven. Accordingly, the etchant L in the tank main body 211 is fed to the nozzle 104 of the substrate treating unit 100 via the main line 251. From the nozzle 104, the etchant L is fed onto the surface of the semiconductor wafer W rotated by the motor 103. The etchant L is recovered via the cup body 101 and stored in the tank main body 221 of the recovery tank 220. The stored etchant L is returned into the tank main body 211 by driving the pump 262. If the etching process of a predetermined number of semiconductor wafers W is completed, the etching process ends (step ST2).

Next, the open valve 212 and the on-off valve 253 are closed, the on-off valve 257 is opened, and the pump 252 is driven to circulate the etchant L. At this time, the concentration sensor 256 detects the nitrous acid concentration in the etchant L. It is determined whether the nitrous acid concentration is a predetermined value or more (step ST3). If the nitrous acid concentration is lower than the predetermined value, the on-off valve 284 of the alcohol feeding line 280 is opened, and the pump 282 is driven to feed IPA into the tank main body 211 (step ST4), thereby generating nitrous acid. This increases the nitrous acid concentration in the etchant L. The alcohol feeding section 310 continues IPA feeding to the tank main body 211 until the nitrous acid concentration detected by the concentration sensor 256 reaches the predetermined value or more. The control unit 300 closes the open valve 212 and the on-off valves 257 and 284 when it detects, based on the output value of the concentration sensor, that the nitrous acid concentration reaches the predetermined value. Then, the next etching process is started (step ST5).

During the etching process in which the etchant L is fed from the nozzle 104 to the surface of the semiconductor wafer W, the on-off valve 257 may be opened to cause the branch portion 254 to divert the etchant L fed by the pump 252 to the substrate treating unit 100 and the tank main body 211. In this case, the nitrous acid concentration in the etchant L fed from the branch portion 254 to the tank main body 211 via the return line 255 is detected by the concentration sensor 256. In other words, the nitrous acid concentration of the etchant L fed from the nozzle 104 is detected while simultaneously feeding the etchant L from the nozzle 104 to the semiconductor wafer W to carry out the etching process. If the detected nitrous acid concentration becomes the predetermined value or less, the on-off valve 253 may be closed at that point in time. It is, however, preferable that the on-off valve 253 be closed to stop feeding of the etchant L to the nozzle 104, at the end of the etching process carried out for the semiconductor wafer W. This is because the generation of defective products, which may be caused by leaving the etching process unfinished, can be suppressed. After that, as described above, IPA is fed to the tank main body 211 to adjust the nitrous acid concentration in the etchant L.

As described above, according to the substrate treating device 10 of this embodiment, if the nitrous acid concentration in the etchant L falls below a predetermined value, IPA is added to generate nitrous acid and enhance the efficiency of the etching process. Hence, the production efficiency of the semiconductor wafer W improves.

FIG. 4 is an explanatory view showing the main part of a substrate treating device 10A according to a modification of the above-described substrate treating device 10. The same reference numerals as in FIG. 1 denote the same functional parts in FIG. 4, and a detailed description thereof will be omitted.

In the substrate treating device 10A, the alcohol feeding line 280 includes a nozzle 290, such as a single-fluid nozzle configured to spray IPA in a fog state, at that outlet end of the main line 281 of the alcohol feeding section 310 which is located in the tank main body 211. The nozzle 290 is located below the liquid surface of the etchant L. Since the IPA is fed from the nozzle 290 in this structure, the etchant L never flows back to the side of the main line 281. In addition, since the contact area to the etchant L is increased by spraying IPA in a fog state, the reaction can easily be prompted relative to a case where IPA is fed in a liquid state. The procedure of the etching process and the effects are the same as those of the above-described substrate treating device 10.

Figure 5:
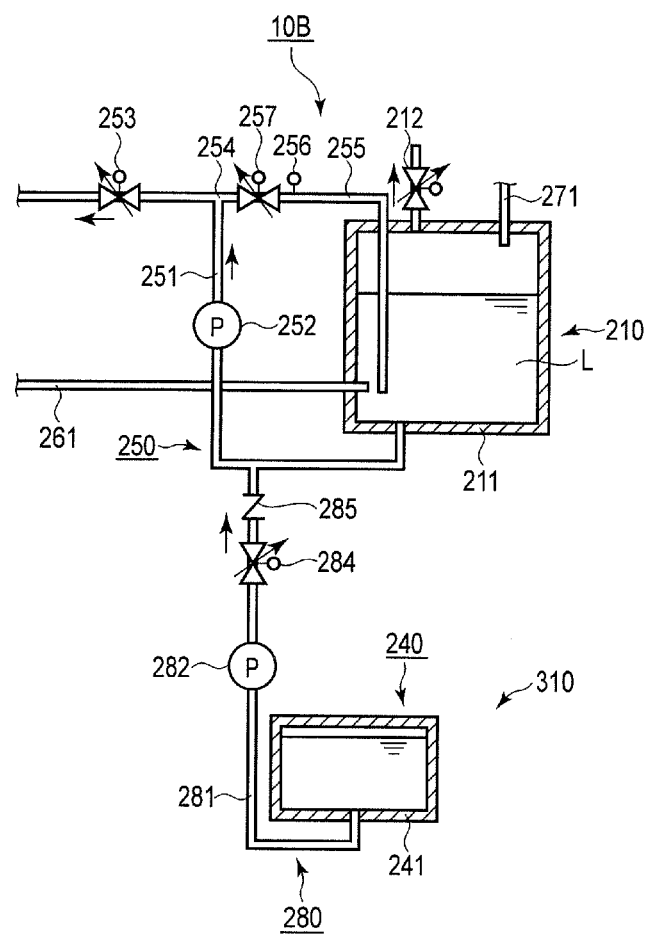
FIG. 5 is an explanatory view showing another modification of the substrate treating device.

FIG. 5 is an explanatory view showing the main part of a substrate treating device 10B according to another modification of the above-described substrate treating device 10. The same reference numerals as in FIG. 1 denote the same functional parts in FIG. 5, and a detailed description thereof will be omitted.

In the substrate treating device 10B, the outlet end of the main line 281 of the alcohol feeding line 280 is connected to the main line 251 of the etchant feeding line 250.

In the substrate treating device 10B having this arrangement, the etching process of the substrate W is performed in the following way. Before the start of the process, a predetermined amount of the new etchant L is stored in the tank main body 211 of the storage tank 210, like the substrate treating device 10. Next, the open valve 212 is closed, the on-off valve 257 is opened, and the pump 252 is driven to circulate the etchant L. When the etchant L passes through the concentration sensor 256, the nitrous acid concentration in the etchant L is detected.

In addition, the open valve 212 and the on-off valve 284 on the main line 281 of the alcohol feeding line 280 are opened, and the pump 282 is driven to feed IPA to the main line 251.

On the other hand, in the tank main body 211, nitric acid in the etchant L decomposes to generate nitrous acid and nitric acid gas. This increases the nitrous acid concentration in the etchant L. The alcohol feeding section 310 continues IPA feeding to the main line 251 until the nitrous acid concentration detected by the concentration sensor 256 reaches a predetermined value. When the nitrous acid concentration reaches the predetermined value, the open valve 212 and the on-off valve 284 are closed. Then, the pump 282 is stopped to stop the feeding of the IPA.

In this arrangement, since IPA is added to the circulation line of the etchant L, mixing of the etchant L and the IPA can be prompted. The procedure of the etching process and the effects are the same as those of the above-described substrate treating device 10.

Note that the outlet end of the main line 281 is connected to the main line 251 of the etchant feeding line 250 but may be connected between the branch portion 254 and the nozzle 104.

In the above-described example, IPA has been exemplified as alcohol. However, the same effects can be obtained using ethyl alcohol. Alcohol in a gaseous state or alcohol in a solid state may be used. The nitrous acid concentration may be measured during the etching process in addition to the time of circulating of the etchant L.

As a method of feeding the etchant L to the semiconductor wafer W, the substrate treating unit which rotates and treats a substrate has been exemplified. However, a batch method may be used in which the etchant L is stored in a treatment vessel, and a plurality of semiconductor wafers W are dipped in the etchant L and treated.

If the batch method is employed, a batch treatment vessel may be used in place of the substrate treating unit 100. The storage tank 210 of the etchant feeding unit 200 may be replaced with a batch treatment vessel. In this case, the alcohol feeding line may directly be connected to the batch treatment vessel to add IPA.

The substrate is not limited to a semiconductor wafer and may be a liquid crystal substrate or a glass substrate such as a photomask. In addition, the treatment is not limited to the etching process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treating device for treating a substrate using a treatment liquid containing hydrofluoric acid and nitric acid, comprising:
   a storage tank configured to store the treatment liquid;
   an alcohol feeding unit configured to feed alcohol to the treatment liquid; and
   a feeding unit configured to feed, to the substrate, the treatment liquid to which the alcohol is fed;
   a main line configured to connect the feeding unit and the storage tank;
   a branch portion provided halfway on the main line, and
   a return line connected from the branch portion to the storage tank.

2. The device according to claim 1, wherein the alcohol feeding unit feeds the alcohol to a position below a liquid surface of the treatment liquid stored in the storage tank.

3. The device according to claim 1, further comprising a concentration sensor configured to detect a nitrous acid concentration in the treatment liquid fed to the feeding unit,
   wherein the alcohol feeding unit is configured to feed alcohol to the treatment liquid if the nitrous acid concentration detected by the concentration sensor is equal to or less than a predetermined value.

4. The device according to claim 3, further comprising a controller configured to stop feeding of the treatment liquid to the feeding unit if the nitrous acid concentration in the treatment liquid detected by the concentration sensor falls below the predetermined value,
   wherein if the concentration sensor detects that the nitrous acid concentration in the treatment liquid fed to the feeding unit falls below the predetermined value when the substrate is being treated, the controller completes treatment of the substrate and thereafter stops feeding of the treatment liquid to the feeding unit.

5. The device according to claim 1, wherein the alcohol feeding unit feeds the alcohol between the storage tank and the branch portion on the main line.

6. A substrate treating method of treating a substrate using a treatment liquid containing hydrofluoric acid and nitric acid, comprising:
   storing the treatment liquid in a storage tank;
   feeding alcohol to the treatment liquid;
   feeding, to the substrate, the treatment liquid to which the alcohol is fed; and
   returning the treatment liquid to which the alcohol is fed to the storage tank via a return line provided halfway on a main line configured to connect a feeding unit configured to feed the treatment liquid to which the alcohol is fed to the substrate and the storage tank.

7. The method according to claim 6, wherein when feeding the alcohol into the storage tank, the alcohol is fed to a position below a liquid surface of the treatment liquid stored in the storage tank.

8. The method according to claim 6, wherein part of the treatment liquid is returned to the storage tank while detecting a nitrous acid concentration in the treatment liquid fed from the storage tank to the substrate.

9. The method according to claim 8, wherein if the nitrous acid concentration in the treatment liquid falls below a predetermined value, treatment of the substrate is completed, and thereafter feeding of the treatment liquid is stopped.

* * * * *